United States Patent [19]

Dellamano

[11] 4,158,809

[45] Jun. 19, 1979

[54] SIGNAL MEASURING AND DISPLAY CONTROL METHOD AND APPARATUS

[75] Inventor: Harry A. Dellamano, Thousand Oaks, Calif.

[73] Assignee: Beckman Instruments, Inc., Fullerton, Calif.

[21] Appl. No.: 772,628

[22] Filed: Feb. 28, 1977

[51] Int. Cl.² ............... G01R 17/06; H03K 5/20; G01R 19/16
[52] U.S. Cl. .................... 324/99 D; 307/231; 324/30 R; 324/103 P; 328/132
[58] Field of Search ........... 324/99 D, 111, 103 P, 324/157, 30 R; 328/132, 114; 177/DIG. 3; 364/466, 567, 568; 307/231

[56] References Cited

U.S. PATENT DOCUMENTS

| | | | |
|---|---|---|---|
| 3,458,809 | 7/1969 | Dorey | 324/99 D |
| 3,746,982 | 7/1973 | Allington et al. | 328/114 |
| 3,984,667 | 10/1976 | Loshbough | 177/DIG. 3 |
| 4,008,405 | 2/1977 | Neumann | 328/132 |
| 4,041,404 | 8/1977 | Lewis, Jr. | 328/132 |

*Primary Examiner*—Rudolph V. Rolinec
*Assistant Examiner*—Ernest F. Karlsen

*Attorney, Agent, or Firm*—R. J. Steinmeyer; R. R. Meads; J. R. Shewmaker

[57] ABSTRACT

Method and apparatus for measuring the magnitude of a varying analog signal and for displaying a close approximation of a final stabilized value before the signal reaches stabilization. An analog-to-digital converter converts the analog signal to corresponding digital pulse signals and the digital pulse signals are displayed to an operator. Automatic display-hold circuitry determines the pulse count difference between successive pulse count signals separated by a predetermined time interval, compares the difference to predetermined value, and, when the predetermined value is reached, generates a control signal which locks the displayed value and prevents the display from updating as the analog signal continues to vary. The difference between pulse signals is taken by storing the first signal in an up/down counter and decrementing the counter in response to the second signal. The circuitry determines the pulse count difference and the sign of the difference between the two signals by counting either (1) the number of remaining pulses in the second signal after the counter decrements to zero or (2) the number of additional pulses required to decrement the counter to zero after termination of the second signal.

10 Claims, 5 Drawing Figures

SIGNAL MEASURING AND DISPLAY CONTROL METHOD AND APPARATUS

BACKGROUND OF THE INVENTION

1. Field of the Invention

The present invention relates generally to the measurement of time varying analog signals and, more particularly, to a method and apparatus for obtaining and displaying a close approximation of the final stabilized value of the analog signal before the signal reaches stabilization. The invention is particularly well suited for use with electrochemical measuring devices, such as pH meters and the like, which generate a drifting analog signal and require that the signal stabilize before an accurate reading can be taken.

2. Description of the Prior Art

Measuring apparatus for taking analytical measurements typically employ a sensor for monitoring a parameter of interest and for generating an analog output signal which provides a measure of the parameter. The response time of the apparatus will depend upon the nature of the measured parameter, the particular analytical method employed, and the type of sensor. For example, in electrochemical analyzers having sensors for monitoring characteristics of chemical reactions, the reaction proceeds to completion over a period of time and the response time of the system is primarily determined by the reaction time itself. In other types of measurements, such as potentiometric measurements employing electrochemical probes for measuring solution pH and the like, the probe or sensor requires a finite time to stabilize after insertion into the solution and the response time of the system is determined primarily by the sensor response. In either case, the sensor will generate a time-varying analog output signal which drifts toward a stabilized final value.

Typically, the drifting output signal in the foregoing apparatus is displayed to an operator, and the operator observes the display and takes a reading when it appears that the displayed signal has stabilized at a final value. Thus, for an analog display indicator, such as a deflecting needle, the operator waits until the needle appears to have stopped moving. For digital displays, the operator waits until the displayed number has remained at the same value for some period. It is evident that if the operator misjudges and takes the reading too soon the recorded value will be in error. On the other hand, valuable time will be wasted if the operator waits an excessive length of time for stabilization.

SUMMARY OF THE INVENTION

The present invention resides in a new and improved method and apparatus capable of measuring and displaying a close approximation of the final stabilized value of a drifting analog signal prior to actual stabilization. To this end, the present invention includes an analog-to-digital converter for generating respective digital pulse count signals corresponding to amplitude values of the analog signal at spaced time intervals, means for displaying the digital pulse count signals, and means for holding a displayed value when the pulse count difference between selected digital pulse count signals, separated by a predetermined time interval, falls to a predetermined value. The difference between selected successive digital pulse count signals provides a measure of the rate of change or slope of the time-varying analog signal, and a final measurement is taken and displayed when this slope falls to the predetermined value.

More particularly, in accordance with a preferred embodiment of the invention, the apparatus for determining the difference between selected digital pulse count signals includes a first counter for storing a first pulse count signal and means for supplying a second pulse signal as a decrementing input to said counter. In this manner, the counter will be decremented to zero if the second signal is larger than the first or will be decremented only partially toward zero if the second signal is smaller than the first. If the counter is decremented to zero by a larger signal, a zero indicator switches the remaining pulse counts of the larger signal as an incrementing input to a second counter and the final count in the second counter represents the difference between the second larger and the first pulse signals. If the first counter decrements only partially toward zero, indicating a second smaller pulse signal, a soure of auxiliary pulses is enabled to supply a pulse output for decrementing the first counter to zero and simultaneously incrementing the second counter. In this case, when the first counter reaches zero, the zero indicator disables the auxiliary pulse source, and the auxiliary pulse count in the second counter represents the difference between the second smaller and the first pulse count signals.

In both cases, the first and second pulse count signals are digitally subtracted and the pulse count difference is stored in the second counter. A digital comparator compares the pulse count difference in the second counter with a preset difference, and generates a display hold signal for locking the displayed value of the analog signal when the pulse count difference drops to the predetermined value.

The measurement between successive pulse count signals is repeated until the predetermined pulse count difference is attained. For this purpose means is provided for temporarily storing the second pulse count signal together with means for transferring the second signal to the first counter if the predetermined pulse count difference was not attained between the first and second signals. A third digital pulse count signal is then supplied as a decrementing input to the first counter whereby a pulse count difference between the second and third signals will be obtained, and so on for third and fourth, fourth and fifth, etc., signals.

Means is provided for increasing or decreasing the interval between selected ones of the digital pulse count signals subtracted from one another. By appropriately setting this predetermined time interval and by setting the predetermined pulse count difference to zero, the apparatus and method of the invention are useful for detecting analog signal peaks and valleys.

DESCRIPTION OF THE PREFERRED EMBODIMENT

Figure 1:
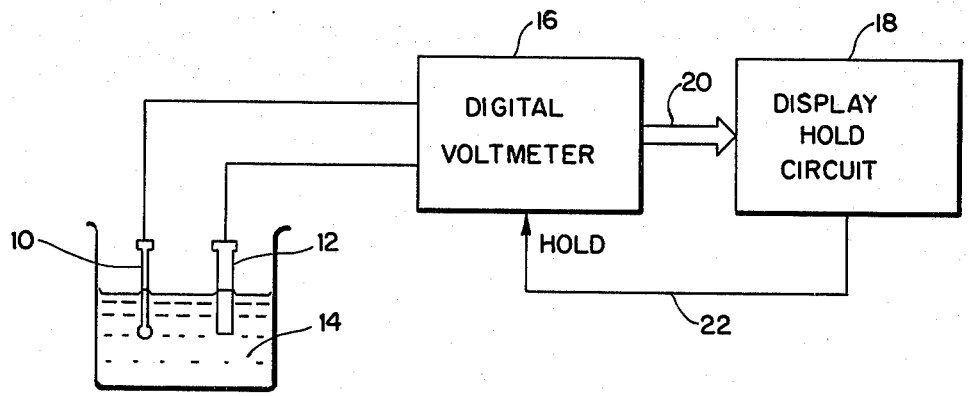
FIG. 1 is a block diagram illustration of a potentiometric measuring apparatus including a digital voltmeter for measuring and displaying solution pH readings and incorporating automatic display hold circuitry in accordance with the present invention.

Referring now to the drawings, and particularly FIG. 1 thereof, the present invention is illustrated as embodied in a potentiometric pH measuring system including a measuring electrode 10 and a reference electrode 12 immersed in a test solution 14 and electrically connected to a digital voltmeter 16. The potential difference established between electrodes 10 and 12 and which is indicative of the pH of solution 14 is supplied to the digital voltmeter which displays the pH indicating signal in eye readable form for an operator. Digital voltmeter 16 in the illustrated embodiment is a conventional "dual-slope" integrating type voltmeter. It will be understood that while the invention is described in the environment of a dual-slope voltmeter, this is by way of illustration only and the invention could be incorporated in other analog-to-digital signal converting systems.

In a pH measuring system the pH signal generated between electrodes 10 and 12 is an analog voltage signal which takes a period of time to stabilize at a magnitude indicative of the pH of solution 14. Such drifting of an analog voltage signal is illustrated by the solid curve of FIG. 2 which is depicted as increasing with time (i.e. positive slope) toward a stable value $V_s$. In some systems the signal may decrease with time (i.e. negative slope) toward a stable value, as depicted by the dashed curve in the figure. This stabilization period may last anywhere from milliseconds to as long as several minutes. As the analog signal drifts toward its stabilized, final value, the reading displayed by the digital voltmeter 16 regularly updates and follows the drift of the signal. As a result, an operator observing the voltmeter and wishing to take a final pH reading, waits until the displayed signal has apparently stabilized.

In accordance with the present invention, and referring again to FIG. 1, display hold circuitry 18 continuously receives measured voltage signal information (together with various timing and control signals) from voltmeter 16 via cable 20. Display hold circuitry 18 analyzes the voltage information from voltmeter 16 while the analog pH signal is drifting toward a stabilized value. If the voltage information meets certain criteria, to be described subsequently, circuitry 18 generates a display hold signal which is supplied over line 22 to lock the then displayed voltage value of voltmeter 16. In this manner, a close approximation of the final pH reading can be automatically measured and retained on the display before the analog signal reaches the final stabilized value.

Figure 3:
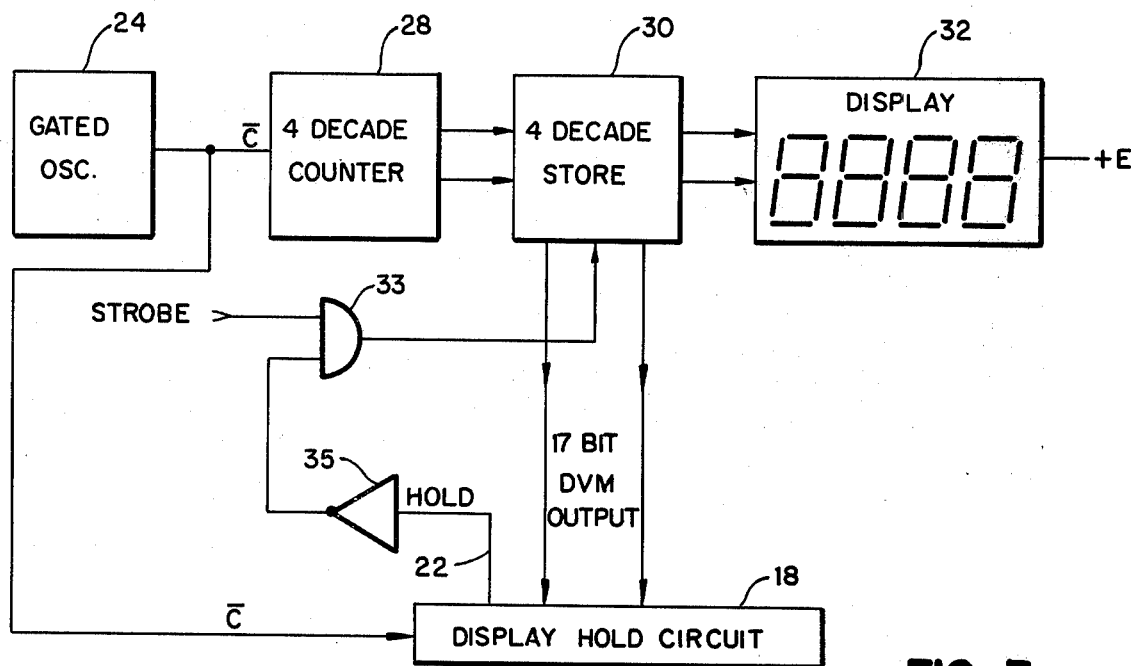
FIG. 3 is a partial block diagram of the digital voltmeter of FIG. 1.
Figure 4:
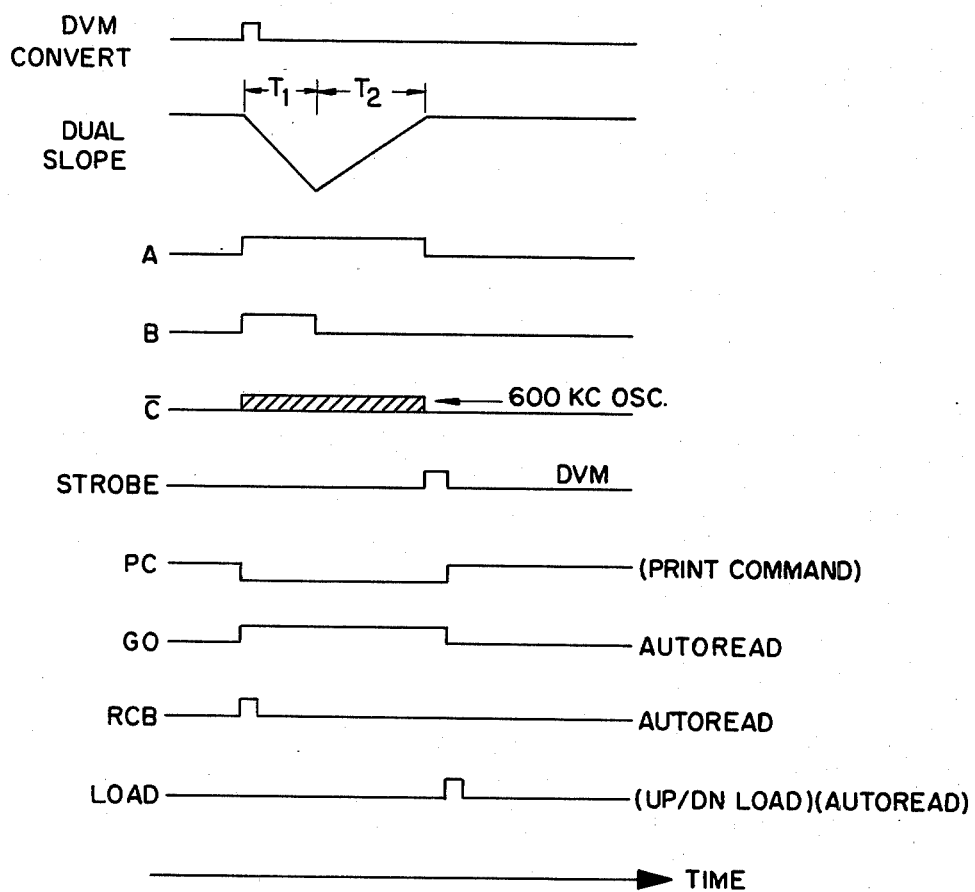
FIG. 4 is a graphical representation with respect to time of various timing and control signals controlling operation of the digital voltmeter and the display hold circuitry of FIG. 1.

Before considering the invention in detail, it will be helpful to briefly consider, in general terms, the operation of dual-slope integrating voltmeter 16. In this regard FIG. 3 illustrates several components of interest in the voltmeter, while FIG. 4 illustrates certain control and timing signals. Seven pulse signals in FIG. 4 are identified as "DVM CONVERT," "DUAL-SLOPE," "A," B," "$\overline{C}$," "STROBE," and "PC." All are generated in a conventional manner within the voltmeter.

The "DVM CONVERT" pulse signal initiates the analog-to-digital conversion of each sampled magnitude value of the analog signal. In the preferred embodiment, the voltmeter 16 converts every 312 milliseconds, and the DVM CONVERT pulse goes high once each 312 milliseconds to initiate each conversion.

The "DUAL-SLOPE" curve depicts the charging of an integrating capacitor by the analog input signal during time interval $T_1$ and subsequent discharging of the capacitor by a reference signal during time interval $T_2$. At the end of $T_2$ the analog magnitude value has been converted to a digital pulse value.

The "A" signal is high for the time period $T_1 + T_2$.
The "B" signal is high during time period $T_1$ only.
The "$\overline{C}$" signal is the pulse output of a gated oscillator during time period $T_1 + T_2$.

The "STROBE" pulse goes high for a brief period at the end of time period $T_2$ to initiate temporary buffer storage and display of the digital pulse signal corresponding to the magnitude of the analog signal.

The "PC" (Print Command) signal, which is low during the $T_1$, $T_2$ and STROBE intervals, goes high at the end of STROBE to signal that the analog-to-digital conversion has been completed and the digital pulse signal has been placed in buffer storage and displayed.

Three remaining control signals "GO," "RCB," and "LOAD" are generated by the display hold circuitry 18 of the invention and will be discussed subsequently.

Referring now to the partial block diagram of FIG. 3, and the signals of FIG. 4, the dual-slope voltmeter 16 includes a gated oscillator 24 (600 kilocycles), a counter 28, a buffer store 30, and a display 32. The pulse output "$\overline{C}$" of oscillator 24 is supplied to the input of the counter 28. Counter 28 is connected to buffer store 30, and the contents of counter 28 are transferred to the store upon receipt by the store of the "STROBE" pulse. The contents of the buffer store are displayed by display 32. In the preferred embodiment, display 32 displays four decimal digits, and counter 28 and store 30 therefore are four-decade devices.

As indicated previously, the dual-slope integrating voltmeter 16 is of conventional circuit design not forming part of the present invention. Basically, the voltmeter samples the analog voltage signal at successive, equally spaced time intervals and generates digital pulse count signals corresponding to the magnitude of the analog signal at each sampled interval. Herein, each conversion operation is initiated by the "DVM CONVERT" pulse which goes high at 312 millisecond intervals. At the beginning of time $T_1$ during each conversion operation, the analog input signal is applied to an integrating capacitor (not shown) and the pulse output "$\overline{C}$" of gated oscillator 24 is fed to the counter 28. The capacitor is charged, as illustrated by the DUAL-SLOPE curve, during fixed time interval $T_1$ established by a predetermined pulse count being reached in the counter. At the end of $T_1$, a predetermined reference voltage (not shown) opposite in sign to the input voltage, is applied to the capacitor to discharge the capacitor during interval $T_2$. Simultaneously, the counter 28 resets and continues counting in response to the pulse signal "$\overline{C}$" from oscillator 24. The capacitor is discharged to zero by the reference signal and the discharge time required establishes the length of $T_2$. Accordingly, the duration of $T_2$ is proportional to the magnitude of the input signal. By stopping counter 28 at the end of $T_2$, the number of pulses generated during $T_2$ and stored in the counter represents the magnitude of the analog input signal. The digital pulse count signal in the counter is then transferred to store 30 by the "STROBE" pulse and displayed by display 32.

In accordance with the present invention, and still referring to FIG. 3, the contents of buffer store 30 and the pulse signal "$\overline{C}$" are both supplied as inputs to display hold circuit 18. Circuit 18, in turn, supplies a "HOLD" signal under certain conditions which overrides or disables the "STROBE" signal to inhibit transfer of the contents of counter 28 to the store. In this manner, the store 30 and hence the display 32 are prevented from updating and the pulse signal value then displayed is thereby locked or held as the final displayed value even though the analog signal still may be changing. To accomplish this, the "STROBE" and "HOLD" signals are supplied as inputs to an AND gate 33, the "STROBE" signal being first fed through an inverter 35. The output terminal of gate 33 is connected to the "STROBE" input terminal of store 30. With this arrangement, when "HOLD" is low the output of inverter 35 will be high to condition AND gate 33 to pass any high "STROBE" pulse supplied to the other input terminal thereof. A "STROBE" pulse passed by gate 33 and supplied to store 30 causes the contents of counter 28 to be loaded into the store. When the "HOLD" signal is high, however, the output of inverter 35 is low thereby disabling AND gate 33 to prevent the gate from passing a "STROBE" pulse thereby preventing the contents of counter 28 from being loaded into store 30. As a result, updating of the store and the display is inhibited so that the pulse count then in the store is retained therein and thus retained by the display.

Figure 2:
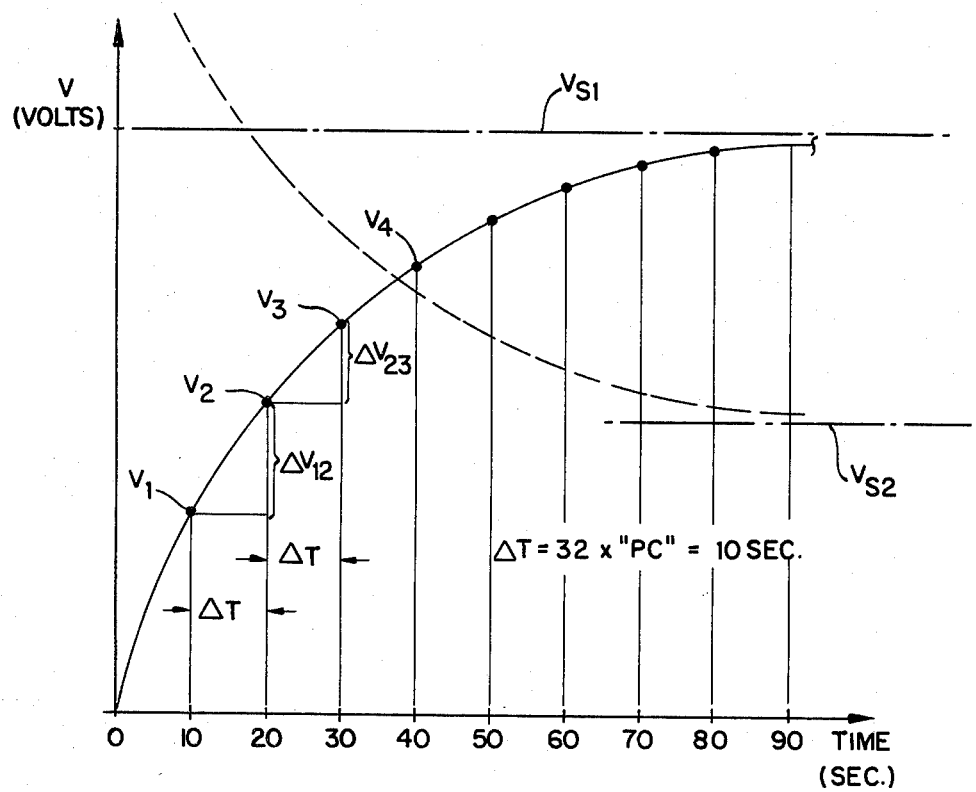
FIG. 2 is a graphical plot of a typical voltage vs. time analog signal derived by the pH measuring electrodes of FIG. 1.

In accordance with the present invention, display hold circuit 18 monitors successive digital pulse count signals separated by a predetermined time period and each representing a respective magnitude value of the drifting analog input signal and substracts successive ones of the pulse count signals to ascertain the pulse count difference therebetween. For example, FIG. 2 illustrates voltage magnitude values $V_1$, $V_2$, $V_3$, etc., taken at successive ten second time intervals $\Delta T$ for determining a pulse count difference $\Delta V$ between each of voltage values $V_1$ and $V_2$, $V_2$ and $V_3$, $V_3$ and $V_4$, and so on. In effect the pulse count difference corresponds to the rate of change of the analog signal with respect to time (i.e. the first derivative or slope of the analog signal). The pulse count difference is compared to a predetermined pulse count value, and when the pulse count difference falls to the predetermined value, the "HOLD" signal is generated for locking the display 32 at the signal value then displayed. In this manner, when the rate of change of the drifting input signal drips to the predetermined value, the display hold circuit 18 automatically ascertains that fact and locks the display to prevent the display from following further drift of the input signal.

Figure 5:
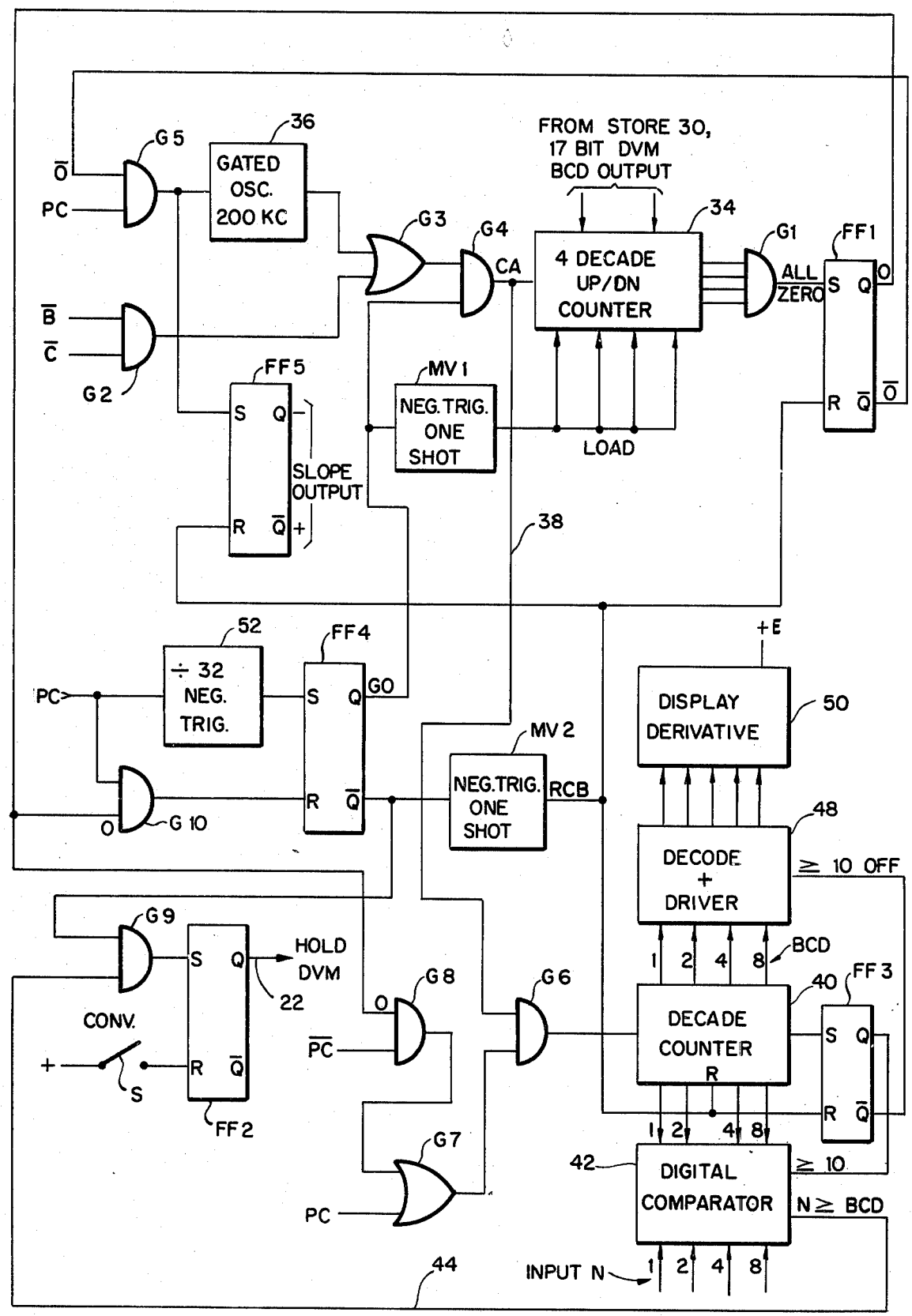
FIG. 5 is a combined schematic and block diagram of the display hold circuitry of the present invention.

Referring now to FIG. 5, the illustrated form of the display hold circuit 18 includes a four decade up/down counter 34 into which is parallel loaded the digital pulse count from buffer store 30 representing the magnitude at one point on the analog input signal. The counter 34 is adapted to be counted down from the stored pulse count value toward zero by a decrementing serial pulse count signal "CA" supplied to a decrementing input terminal of the counter. A zero indicator flip-flop, $FF_1$, is provided to signal the zero or non-zero state of counter 34. $FF_1$, of conventional design, includes set and reset input terminals and Q and $\overline{Q}$ output terminals. When the set terminal goes high, the Q output terminal is driven high and $\overline{Q}$ is driven low. When the reset terminal goes high, the Q output terminal is driven low and $\overline{Q}$ is driven high. Four borrow lines from counter 34, one per decade, are connected through an AND gate $G_1$ to the set terminal of $FF_1$. As a result, when counter 34 is decremented to zero by signal "CA," the four borrow lines go high and drive the set terminal of $FF_1$ high to produce a high output signal, designated "0", at the Q terminal and a low output signal, designate "$\overline{0}$", at the $\overline{Q}$ terminal.

A pulse count signal for a second point on the analog curve, and which is to be compared to the prior signal stored in counter 34, is the portion of the output signal "$\overline{C}$" (FIG. 4) from oscillator 24 (FIG. 3) generated during interval $T_2$. In this regard, AND gate $G_2$ receives a second input signal "$\overline{B}$" (i.e. the inverse of signal "B" generated by passing "B" through an inverter) which prevents gate $G_2$ from passing pulses of "$\overline{C}$" during charging interval $T_1$ and only permits passage of pulses by gate $G_2$ during $T_2$. As a result, gate $G_2$ passes during $T_2$ the second pulse count signal to be compared with the first signal in counter 34. The second pulse count signal is supplied from AND gate $G_2$, through OR gate $G_3$, and AND gate $G_4$ as the decrementing serial pulse count input "CA" to counter 34. During $T_1$ and $T_2$, $G_4$ also receives a second input signal designated "GO" described subsequently.

A gated oscillator 36 (200 kilocycles), which is a source of auxiliary pulses, has the pulse output signal therefrom coupled through gates $G_3$ and $G_4$ to supply an additional decrementing pulse count input to counter 34 after the counter has been decremented by the second pulse signal supplied through gate $G_2$. In this regard, auxiliary oscillator 36 is enabled by the output of AND gate $G_5$ which receives as its two input signals the "$\overline{0}$" output from zero indicator $FF_1$ and the "PC" signal (FIG. 4). Thus, oscillator 36 is enabled only when the "PC" signal is high and when counter 34 is not in a zero condition. It will be apparent that oscillator 36 is enabled to supply auxiliary pulses during periods when gated oscillator 24 (FIG. 3) is off. Thus, if desired, oscillator 24 could be suitably controlled to function as the source of auxiliary pulses during its normal "off-time" in lieu of oscillator 36.

The decrementing pulse count input terminal to counter 34 is also connected over line 38 and through an AND gate $G_6$ to the incrementing input terminal of a second counter 40. AND gate $G_6$ has its second input terminal coupled to the output of OR gate $G_7$. One input of OR gate $G_7$ receives the "PC" signal. The other input of $G_7$ is coupled to the output of AND gate $G_8$. AND gate $G_8$ receives at its inputs the "0" signal and "$\overline{PC}$" signal (i.e. the inverse of "PC"). It will become apparent that with this arrangement a pulse count difference signal is supplied serially over line 38 to the second counter 40 representing the pulse count difference between the first pulse count initially stored in up/down counter 34 and the second pulse count of the subsequently measured value of the analog input signal. The pulse count difference stored in second counter 40 thus represents the pulse count difference between successively measured magnitude values of the analog input signal, i.e. the first derivative or rate of change or slope of the analog input signal.

A digital comparator 42 is connected to the second counter 40 to monitor the pulse count difference in the counter. A predetermined pulse count value is set in digital comparator by operator control switches N. If the pulse count difference signal value in counter 40 exceeds the preset value of comparator 42, the comparator supplies a low control signal over output line 44. When the pulse count value drops to or falls below the preset comparator value, the comparator supplies a high control signal to the output line.

Output line 44 from comparator 42 is in turn connected through AND gate $G_9$ to the set input terminal of a second flip-flop $FF_2$. The Q output terminal of $FF_2$ is coupled to supply the "HOLD" signal through inverter 35 and AND gate 33 (FIG. 3) for locking display 32 in the manner previously described. In this manner, when the pulse count difference signal between successively measured points on the analog input signal drops to a predetermined value, comparator 42 supplies a high control signal which sets $FF_2$ driving the Q output thereof high thereby generating the "HOLD" signal to lock display 32.

The reset terminal of $FF_2$ is coupled to a pulse source (+) through a switch S which may be operator controlled. Closing switch S resets $FF_2$ driving the Q output thereof low to remove the "HOLD" signal. This unlocks display 32 by enabling gate 33 to pass "STROBE" pulses to store 30 to update the store and hence the display.

If desired, the pulse count difference signal in counter 40, which represents the slope of the analog signal, may be supplied through a decoder and driver circuit 48 to auxiliary display 50 for displaying to an operator the actual pulse count difference. In the preferred embodiment, second counter 40 comprises only one decade so that until the analog signal is close to stabilizing, the pulse count difference between points on the signal will probably exceed the capacity of counter 40. For this reason, the carry output terminal of counter 40 is coupled to the set terminal of a third conventional flip-flop $FF_3$. The $\overline{Q}$ output terminal of $FF_3$ is coupled as a disabling input to the decoder and driver circuit 48 and the Q output terminal is coupled as a disabling input to comparator 42. Thus, the output signals from $FF_3$ disable the comparator and prevent display of the pulse count difference when the difference exceeds the one decade capacity of counter 40. If desired, the capacity of counter 40 could be increased beyond one decade to allow display of all slope values.

The control and timing for display hold circuit 18 is initiated by operation of a further conventional flip-flop $FF_4$ which supplies the "GO" control signal from its Q output terminal. The set terminal of $FF_4$ is connected to the output terminal of a frequency division timing circuit 52 which receives recurring voltmeter signal "PC" (FIG. 4) at an input terminal thereof. Circuit 52, which is negatively triggered, counts a predetermined number of "PC" pulses, for example 32, and generates an output signal at the end thereof. Recall that digital voltmeter 16 converts every 312 milliseconds in the preferred embodiment, and that "PC" recurs at the same interval. As a result, by counting 32 "PC" pulses, frequency division timing circuit 53 measures and generates an output pulse at the end of a timing interval of approximately 10 seconds. $FF_4$ is set by the output pulse from circuit 52 thereby generating the "GO" signal at its Q terminal once every 10 seconds. FIG. 2 depicts this 10 second time interval $\Delta T$ between successive voltage magnitude values. In this 10 second interval the digital voltmeter 16 converts and displays magnitude values of the analog signal 32 times.

The reset terminal of $FF_4$ is connected to the output of an AND gate $G_{10}$ which receives as its respective inputs the "PC" and "0" signals.

The Q output terminal of $FF_4$ is connected to one input terminal of AND gate $G_4$ and to the trigger input terminal of a conventional negative triggered one-shot multivibrator $MV_1$. The pulse output terminal of $MV_1$ is connected to supply a "LOAD" signal to up/down counter 34 for loading the counter with the contents of buffer store 30 (FIG. 3).

The $\overline{Q}$ output terminal of $FF_4$ is connected to one input terminal of AND gate $G_9$ and to the trigger input terminal of a second negative triggered one-shot multivibrator $MV_2$. The pulse output terminal of $MV_2$ is connected to the reset terminals of $FF_1$, $FF_3$ and counter 40.

The output of $MV_2$ is further connected to the reset input terminal of the fifth flip-flop $FF_5$ the set terminal of which is connected to the output of AND gate $G_5$. The output of $FF_5$ indicates the sign (i.e. positive or negative) of the slope of the analog input signal. When $FF_5$ is set, the Q output is high indicating a negative slope. When $FF_5$ is reset, $\overline{Q}$ is high indicating a positive slope.

Operation of the display hold circuit 18 is as follows. Assume that a changing analog input signal is present and that up/down counter 34 has been loaded with a pulse count signal corresponding to the magnitude at a first point on the analog signal. The difference between the stored pulse count at the first point on the curve and the pulse count at a second point on the curve spaced a predetermined distance from the first point is to be determined. Recall that the digital voltmeter 16 converts every 312 milliseconds and a new pulse count is available for each conversion. In the preferred embodiment, the first pulse count in counter 34 is to be compared with a second count obtained about 10 seconds later. For this purpose, frequency division timing circuit 52 counts 32 "PC" pulses, one per 312 milliseconds, and generates an output pulse at the end of 10 seconds. The output pulse sets $FF_4$ and drives the Q output terminal thereof high to supply a high "GO" signal to one input of AND gate $G_4$. The positive going "GO" signal has no effect on $MV_1$ since $MV_1$ is triggered only by a negative going signal.

At the same time, the $\overline{Q}$ output signal of $FF_4$ is driven low and this negative going signal triggers $MV_2$ which supplies an output pulse signal "RCB" to reset $FF_1$, decade counter 40, $FF_3$, and $FF_5$.

At this point the circuit is ready to receive the pulse count signal from digital voltmeter 16 corresponding to the second point on the analog signal. Recall from the dual-slope timing diagram of FIG. 4 that the portion of the "$\overline{C}$" pulse count signal during time interval $T_2$ represents the magnitude of the analog signal. In FIG. 5, pulse count "$\overline{C}$" is supplied as one input to AND gate $G_2$. Gate $G_2$ is enabled during $T_2$ by the other input $\overline{B}$ thereto. Thus, gate $G_2$ passes the second pulse count signal during $T_2$. The second signal is supplied through OR gate $G_3$ and AND gate $G_4$ (enabled by $FF_4$) as the decrementing pulse count signal "CA" supplied to up/down counter 34. In this manner, the prior pulse count in up/down counter 34 is decremented by the new pulse count.

Assume first that the new pulse count is greater than the prior pulse count. In this case, counter 34 will be decremented to zero before the end of $T_2$ with pulses still remaining in the decrementing signal. The resulting zero condition of counter 34 sets $FF_1$ which drives the Q output terminal thereof high supplying a zero indicating "0" signal which, together with signal $\overline{PC}$, enables AND gate $G_8$. Gate $G_8$ in turn enables AND gate $G_6$ through OR gate $G_7$ to gate the remaining counts in decrementing pulse count signal "CA" over line 38 into decade counter 40. The number of remaining counts thus stored in counter 40 is the number of counts by which the new pulse count exceeds the previous pulse count stored in counter 34, i.e. represents the difference between the new and old pulse count values.

Alternatively, if the new pulse count is less than the previous pulse count stored in counter 34, then at the end of $T_2$ the pulse count signal "$\overline{C}$" supplied as the decrementing count "CA" will have only decremented counter 34 partially to zero. In such case the $\overline{Q}$ output of zero indicating $FF_1$ remains high and is supplied as a high input to AND gate $G_5$. Thereafter, when the "PC" signal supplied to AND gate $G_5$ goes high (see FIG. 4), the output of $G_5$ triggers auxiliary oscillator 36 which supplies auxiliary output pulses through OR gate $G_3$ and AND gate $G_4$ as the decrementing pulse count signal "CA" to counter 34. Simultaneously, "PC" enables AND gate $G_6$ through OR gate $G_7$ so that the pulses generated by auxiliary oscillator 36 are supplied over line 38 through $G_6$ into decade counter 40. When the auxiliary pulses decrement counter 34 to zero, the borrow output from the counter sets $FF_1$ driving the $\overline{Q}$ output terminal thereof low to supply a low "0" signal to AND gate $G_5$ thereby disabling auxiliary oscillator 36 and terminating the output pulses therefrom. The auxiliary pulse count thus established in counter 40 represents the number of additional pulses required to decrement counter 34 to zero and thus represents the number of pulses by which the previous pulse count, as stored in counter 34, exceeded the new pulse count. Thus, for the case where the new pulse count is less than the previous pulse count, counter 40 again stores a pulse count difference between the two readings.

In the latter case where the new reading is less than the previous reading, the analog signal has a negative slope and $FF_5$, set by the output of $G_5$, supplies a high minus slope indication at its Q output terminal. Alternatively, if the new reading exceeds the previous reading, $G_5$ does not set $FF_5$ and $FF_5$ supplies a high positive slope indication at its $\overline{Q}$ output terminal.

The pulse count difference stored in counter 40 is compared to a pulse count value preset into digital comparator 42. If the pulse count difference falls below a predetermined value, comparator 42 supplies a high control signal over conductor 44 to one input of AND gate $G_9$. The other input to AND gate $G_9$ is enabled by $\overline{Q}$ of $FF_4$ when $FF_4$ is reset at the end of the "GO" cycle. $FF_4$ is reset through gate $G_{10}$ (connected to the reset terminal of $FF_4$) when the "PC" signal (FIG. 4) next goes high. Resetting $FF_4$ drives its $\overline{Q}$ terminal high thus enabling $G_9$ to set $FF_2$ and generate the high "HOLD" signal at the Q terminal thereof. "HOLD" is applied over line 22 (FIG. 3) to inhibit loading of buffer store 30 thereby preventing display 32 from updating as previously described.

The pulse count difference in counter 40 is also supplied through decode and driver circuit 58 to auxiliary display 50 to display the pulse count difference. If desired, the output of the slope indicating $FF_5$ may be coupled to the same display to display the positive or negative sign of the slope.

If the pulse count difference derived in counter 40 exceeds the predetermined value in comparator 40, the "HOLD" signal is not generated by comparator 42 and $FF_2$. However, the "PC" and "0" signals will enable $G_{10}$ in the manner previously described to reset $FF_4$ driving the Q output terminal thereof low and the $\overline{Q}$ output terminal high. The negative going signal at the Q terminal is supplied as a triggering input to $MV_1$. $MV_1$ in turn generates an output "LOAD" pulse (FIG. 4). The "LOAD" pulse is supplied as a load input to counter 34 to load the pulse count value in buffer store 30, corresponding to the second pulse count signal just measured, into counter 34. Thereafter, timing circuit 52 establishes a new 10 second interval after which a new third pulse count signal will be derived for comparison with the second pulse count now stored in up/down counter 34. The cycle will be repeated at succeeding 10 second intervals for the third and a fourth, the fourth and a fifth, etc., signals until two successive pulse count values are found, separated by 10 seconds, which differ by the predetermined pulse count value or less. At such time the pulse count in the display 32 is considered a satisfactory value or sufficiently close approximation of the final stabilized signal value to be locked in display 32 as the final reading even though the analog signal may continue to vary.

It will be understood that monitoring the converted magnitude of the analog signal at a 10 second time interval $\Delta T$ is an arbitrary selection. The time interval will depend upon the frequency division value set in timing circuit 52 which can be set at any desired value. Thus, if instead of dividing by 32, the circuit divided by 16, for example, the time interval would be five seconds. If division by one were employed, the pulse count difference would be calculated between pulse count signals for each conversion of the digital voltmeter 16, i.e. the time interval $\Delta T$ would be 312 milliseconds.

While the circuitry of FIG. 5 has been illustrated above to digitally measure the rate of change or slope of an analog signal and to lock a displayed value of the analog signal when the slope decreases to a predetermined value, it will be apparent that the circuit can readily detect and display values of peaks and valleys in a varying analog signal. In such a case, the predetermined pulse count value set into digital comparator 42 is zero counts, so that the circuit detects pulse count differences of zero, i.e. zero slopes. The "HOLD" signal in such case locks display 32 at the peak or valley pulse count value. Further, high resolution can be obtained by reducing the division factor of frequency division timing circuit 52, for example to one, so that the compared pulse count values are those generated by each conversion of the digital voltmeter 16.

From the foregoing it is apparent that the invention satisfies a need for a signal measuring and display control method and apparatus for automatically measuring and displaying a close approximation of a final stabilized signal value before actual signal stabilization. The invention thus eliminates operator guesswork as to whether the signal has sufficiently stabilized to read. The adjustable frequency division timing circuit 52 enhances the versatility of the apparatus by enabling the timing interval $\Delta T$ to be decreased to a value as low as the conversion interval of the digital voltmeter 16. This allows the apparatus to be adapted to the specific nature of the analog signal. Moreover, the adjustable control switches N of comparator 42 enable the present pulse count difference to be varied to adjust the precision with which the signal locked by display 32 approximates the final stabilized value. As a peak and valley detector, with the control switches N set for a zero pulse count difference, the apparatus enables the peak or valley value of a varying analog signal to be determined and retained on display 32.

While a preferred embodiment of the invention has been illustrated and described, it will be apparent that modifications may be made therein without departing from the spirit and scope of the invention as defined by the appended claims.

What is claimed is:

1. A method of measuring a parameter of interest using sensing means for monitoring said parameter and generating an electrical analog signal the amplitude of which approaches, over a period of time, a stabilized value indicative of said parameter, said method providing a measure of said parameter prior to stabilization of said analog signal and comprising the steps of:
 measuring the amplitude of said analog signal at a plurality of successive, predetermined time intervals prior to stabilization thereof;
 generating respective digital pulse count signals corresponding to the measured amplitude values of said analog signal;
 subtracting successive ones of said digital pulse count signals to derive a pulse count difference between said successive digital pulse count signals;
 comparing said pulse count difference to a predetermined pulse count value; and
 outputting as said measure of said parameter the amplitude value of said analog signal corresponding to a measurement for which said pulse count difference attains said predetermined value.

2. A method of claim 1 including the further step of:
 displaying in eye readable form the amplitude value of said analog signal and updating the displayed amplitude value as the amplitude thereof approaches said stabilized value; and wherein
 the step of outputting includes inhibiting further updating of the displayed value of said signal when said predetermined pulse count difference attains said predetermined value.

3. Apparatus for measuring a parameter of interest comprising:
 sensing means for monitoring said parameter and generating an electrical analog signal the amplitude of which approaches, over a period of time, a stabilized value indicative of said parameter;
 converter means including a pulse generator and a pulse counter for generating respective digital pulse count signals corresponding to amplitude values of said analog signal at spaced time intervals;
 display means for displaying said digital pulse count signals;
 means for subtracting successive ones of said digital pulse count signals separated by a predetermined time interval to derive a pulse count difference between said successive digital pulse count signals;
 means for comparing said pulse count difference to a predetermined pulse count value and for generating a display control signal when said pulse count difference attains said predetermined value; and
 means for coupling said display control signal to lock the displayed digital pulse count signal thereby providing said measure of said parameter prior to stabilization of said analog signal.

4. The apparatus of claim 3 wherein said means for subtracting successive ones of said digital pulse count signals comprises:
 a first counter for storing a first one of said successive signals;
 means for supplying a second one of said successive signals as a decrementing input to said first counter for decrementing the stored count therein;
 a second counter;
 means responsive to decrementing of said first counter to zero for switching any remaining pulses in said second one of said successive signals as an incrementing input to said second counter whereby said second counter stores the pulse count difference between said first and second ones of said successive signals when said second one of said successive signals is the greater of the two;
 an auxiliary pulse generator;
 said responsive means including means for coupling the pulse output from said auxiliary pulse generator as a decrementing input to said first counter and as an incrementing input to said second counter in response to a non-zero condition in said first counter after decrementation by said second one of said successive signals; and
 said responsive means further including means for terminating the incrementing pulse input to said second counter from said auxiliary pulse generator when said pulse input decrements said first counter to zero whereby the second counter stores the pulse count difference between said first and second ones of said successive signals when said first one of said signals is the greater of the two.

5. The apparatus of claim 4 further including:
 means for temporarily storing said second one of said successive signals;
 means for transferring said second signal from said storage means to said first counter if said predetermined pulse count difference between said first and second ones of said successive signals has not attained said predetermined value; and wherein
 said supplying means supplies a third one of said successive signals as a decrementing input to said first counter for decrementing the second pulse count signal therein.

6. In a method of measuring a parameter of interest using sensing means for monitoring said parameter and generating an electrical analog signal the amplitude of which is indicative of said parameter, comprising the steps of:
 measuring the amplitude of said analog signal at a plurality of successive, predetermined time intervals;
 generating respective digital pulse count signals corresponding to the measured amplitude values of said analog signal;
 subtracting successive ones of said digital pulse count signals to derive a pulse count difference between said successive digital pulse count signals;
 comparing said pulse count difference to a predetermined pulse count value; and
 outputting as said measure of said parameter the amplitude value of said analog signal corresponding to a measurement for which said pulse count difference attains said predetermined value.

7. The method of claim 6 wherein said predetermined pulse count value is substantially zero whereby said outputed measure is indicative of a peak or valley in said analog signal.

8. Apparatus for measuring a parameter of interest comprising:

sensing means for monitoring said parameter and generating an electrical analog signal indicative of said parameter;

converter means including a pulse generator and a pulse counter for generating respective digital pulse count signals corresponding to amplitude values of said analog signal at spaced time intervals;

means for subtracting successive ones of said digital pulse count signals separated by a predetermined time interval to derive a pulse count difference between said successive digital pulse count signals; and means for comparing said pulse count difference to a predetermined pulse count value and for generating an output signal when said pulse count difference approximates zero to provide an indication of a peak or valley in said analog signal.

9. The apparatus of claim 8 further including display means for displaying said digital pulse count signals; and means responsive to said output signal for locking said display means on a count indicative of said peak or valley.

10. The apparatus of claim 8 wherein said means for subtracting successive ones of said digital pulse count signals comprises:

a counter for storing a first one of said successive signals;

means for supplying a second one of said successive signals as a decrementing input to said counter for decrementing the stored count therein; and means responsive to decrementing of said counter to zero for sensing any remaining pulses in said second one of said successive signals.

* * * * *